United States Patent [19]

Barabash et al.

[11] Patent Number: 5,224,119
[45] Date of Patent: Jun. 29, 1993

[54] VECTOR FM MODULATOR

[75] Inventors: Darrell W. Barabash; Theo J. Smit, both of Calgary, Canada

[73] Assignee: NovAtel Communications Ltd., Calgary, Canada

[21] Appl. No.: 778,567

[22] Filed: Oct. 17, 1991

[51] Int. Cl.$^5$ .......................................... H04L 27/20
[52] U.S. Cl. ...................................... 375/59; 375/67; 332/117; 455/102
[58] Field of Search .................. 375/67, 10, 44, 45, 375/59; 455/42, 110, 102; 370/120; 332/117, 100

[56] References Cited

U.S. PATENT DOCUMENTS

| | | | |
|---|---|---|---|
| 4,745,628 | 5/1988 | McDavid et al. | 375/67 X |
| 4,843,351 | 6/1989 | Edwards et al. | 375/10 X |
| 5,091,705 | 2/1992 | Hiramatsu et al. | 375/67 X |
| 5,121,412 | 6/1992 | Borth | 375/67 |

Primary Examiner—Curtis Kuntz
Assistant Examiner—Bryan E. Webster
Attorney, Agent, or Firm—Cesari and McKenna

[57] ABSTRACT

A cellular-telephone transmitter (10) employs a vector modulator (14). An integrating circuit (52) generates the integral of the message signal and applies it to circuitry (54, 56) for generating in-phase and quadrature modulation signals representing the cosine and sine, respectively, of the integrating-circuit output. The vector modulator (14) produces the desired FM signal by adding together quadrature and in-phase versions of a carrier in proportion to the values that the quadrature and in-phase modulating signals represent.

3 Claims, 2 Drawing Sheets

VECTOR FM MODULATOR

BACKGROUND OF THE INVENTION

The present invention is directed to radio transmission. It finds particular, although not exclusive, application to cellular telephones.

In order to achieve more-efficient use of the spectrum allocated to cellular-telephone use, the industry is moving to digital transmission, which facilitates time-division multiplexing of cellular-telephone signals. While this approach clearly provides the potential for significant improvement in channel capacity, the unavoidable transition period during which the previous, analog-frequency-modulation approach and the proposed, digital-phase-modulation approach must both be used has necessitated some equipment complexity. For example, base stations will need to interrogate the user equipment to determine whether it operates under the previous standard or the new one, and the base station must adapt to that standard.

Conversely, since not all base stations will immediately have the capability to operate under the new standard, subscriber terminal equipment that can operate under the new standard will also have to be able to operate under the old standard. Since the analog frequency-modulation mode is often embodied in voltage-controlled-oscillator circuitry while the typical new-standard equipment comprises a vector modulator, providing both capabilities can necessitate a costly duplication of circuitry. This cost results not only from the circuitry duplication but also from perpetration of the already prevalent expense of individually adjusting analog frequency-modulation circuitry during manufacture.

SUMMARY OF THE INVENTION

The present invention provides a way of eliminating most of the equipment duplication that might otherwise have been necessitated by the requirement for dual-mode capability, and it does so in a way that eliminates much of the expense that has previously been associated with individual adjustment of analog frequency-modulation equipment.

According to the present invention, frequency modulation is achieved by employing a vector modulator, which can be used for new-standard phase-shift keying. Integrating circuitry receives the message signal and performs at least an integration operation on it. The resultant output is then processed by circuitry that computes the sine and cosine of the output and applies these as the quadrature and in-phase modulating signals to the vector modulator. In the usual fashion, the vector modulator adds together quadrature and in-phase versions of a carrier in proportion to the quadrature and in-phase modulating signals. The resultant output is the carrier frequency modulated by the (typically also filtered) message signal.

Such an arrangement enables considerable reduction in equipment duplication because the same vector modulator can be used both for the frequency-modulation and for the phase-modulation modes. Moreover, the integration and computation of the trigonometric functions can readily be performed by the same digital-signal-processing circuitry that would be used for the various encoding and filtering steps required for the digital phase-shift-keying standard. Additionally, performing the processing steps according to the invention allows an implementation that does not require the individual adjustments ordinarily associated with voltage-controlled-oscillator frequency-modulation circuitry.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 1:
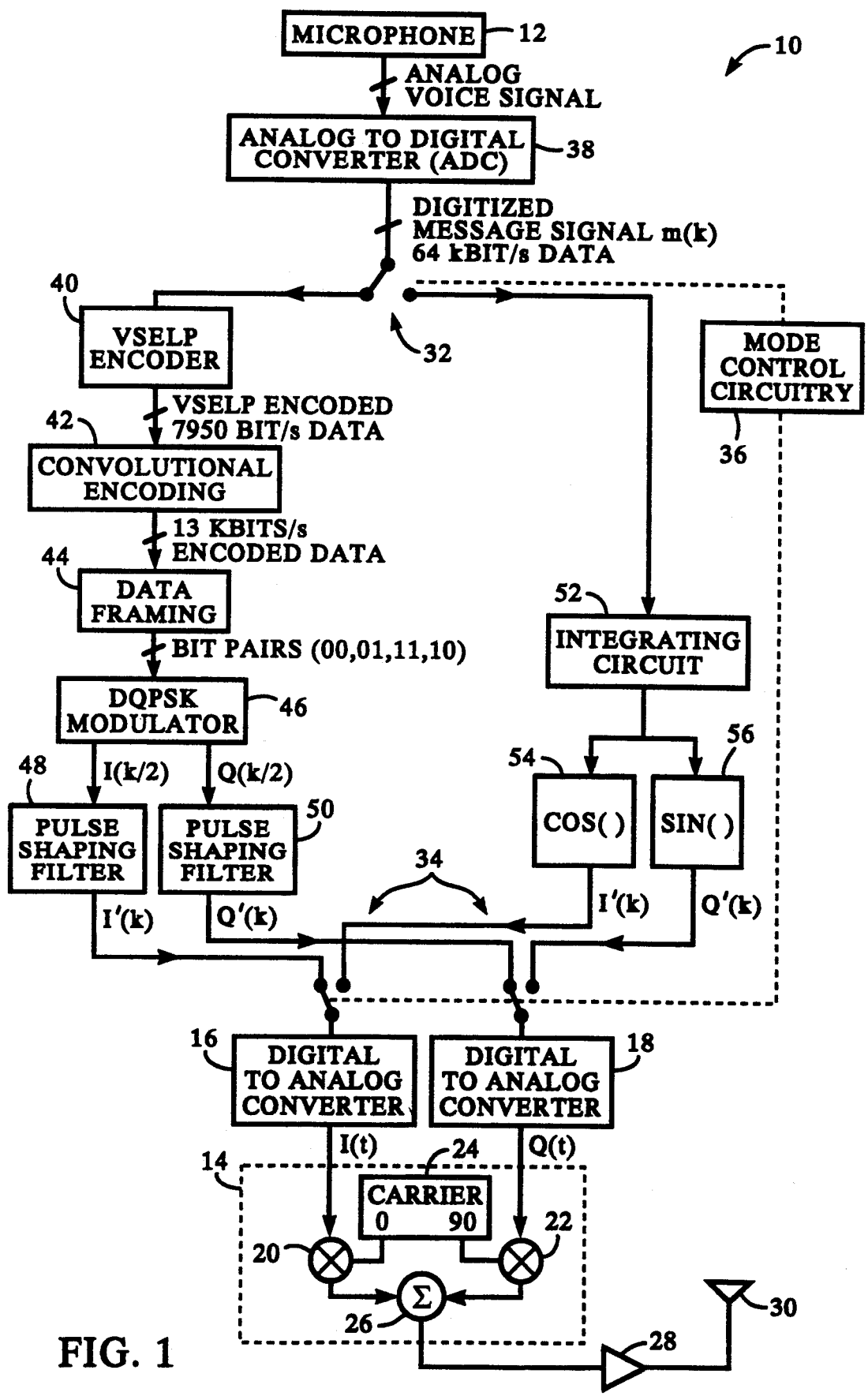
FIG. 1 is a block diagram of the transmitting section of a cellular telephone that employs the teachings of the present invention.

FIG. 1 depicts the transmitter section 10 of a typical cellular-telephone subscriber unit provided with dual-mode capability. The user speaks into a microphone 12, and the resulting signals are processed in accordance with one of two alternative processing sequences before being applied to a common vector modulator 14. The vector modulator 14 may include a digital-to-analog-conversion capability represented in FIG. 1 by two digital-to-analog converters 16 and 18, which receive in-phase and quadrature modulating signals, respectively, and apply them to respective multipliers 20 and 22. A phase splitter 24 generates in-phase and quadrature versions of a carrier signal, which are applied as the other inputs to multipliers 20 and 22, respectively. An analog summing circuit 26 adds the resultant product signals to generate an output that an amplifier 28 applies to an antenna 30 for transmission.

For purposes of illustration, FIG. 1 depicts the selection of the processing sequence as occurring by means of switches 32 and 34, which operate in a ganged fashion to direct the input to the process blocks on the left or right side of the drawing and apply the signal from the same side to the vector modulator. Control circuitry 36 operates in a conventional manner to select the proper switch states. In general, the selection occurs in response to command signals from a base station that indicate whether the transmission should occur by digital phase modulation or analog frequency modulation.

Although the two signal processes are shown separately in FIG. 1 for conceptual purposes, they would in practice be embodied in the same digital signal processor: the "switching" would occur by means of changes in the digital signal processor's programming. In FIG. 1, the switches 32 and 34 are in their left-hand states, indicating that the digital-signal-processing circuitry is currently under the control of its digital-phase-shift-keying program. In this mode, an analog-to-digital converter 38 converts the analog message signal from the microphone 12 to a digital message signal, which switch 32 directs to an encoder 40.

In the particular case of the North American standard, the encoder employs a vector-sum-excited-linear-prediction (VSELP) data-compression algorithm. Standard-specified convolutional-encoding and data-framing operations are performed in steps represented by blocks 42 and 44 to generate bit pairs applied to a 45-degree-shifted differential-quadrature-phase-shiftkeying (DQPSK) modulator 46. According to the modulation scheme implemented by modulator 46, each of the four possible bit pairs represents changing the output phase by a different phase advance or lag from the previous phase, the possible lags and advances being $\pm 45°$ and $\pm 136°$. The modulator 46 produces the raw outputs that, if applied directly to the vector modulator 14, would result in abrupt phase changes corresponding to the abrupt changes in the DQPSK-modulator input. Since such abrupt changes would cause the resultant output spectrum to exceed the allotted bandwidth, however, pulse-shaping filters 48 and 50 smooth the output so as to make the transitions more gradual and thus limit the bandwidth. The resultant digital signals are applied as inputs to respective digital-to-analog converters 16 and 18, and the vector modulation occurs in the manner described above.

This processing sequence is typical for DQPSK modulation. However, not all base stations will have the capability to operate in a DQPSK mode when digital transmission is first introduced. A base station lacking such a capability will not give the control circuitry 36 the command to implement the phase-shift-keying protocol, and it will accordingly cause "switches" 32 and 34 to assume their right-hand states, in which the subscriber unit 10 implements analog frequency modulation.

In accordance with the present invention, the analog frequency modulation begins with an integration circuit 52. The integration circuit 52 performs at least an integration operation, possibly with one or more other operations and typically in a digital form. If the integration is digital, the circuitry can be arranged, as FIG. 1 indicates, so that the two transmission modes share a common analog-to-digital converter 38.

For the purpose of explanation, we will initially consider integration circuit 52 to be a simple integrator. Its output is applied to cosine and sine circuits 54 and 56, which compute the cosine and sine, respectively, of the integrator-circuit output. The resultant values cause the vector modulator 14 to produce the desired frequency-modulated signal.

To understand this result, one must remember that the time-dependent value of a frequency-modulated signal $v_{fm}(t)$ can be described mathematically as $$v_{fm}(t) = \cos(\omega_c t + \beta \int m(t) dt). \tag{1}$$

where $\omega_c$ is the carrier frequency, $m(t)$ is the frequency-modulating signal, and $\beta$ is the frequency-deviation constant.

By recalling the trigonometric identity for the cosine of a sum, one can see that $V_{fm}(t)$ contains two orthogonal components:

$$V_{fm}(t) = \cos(\beta \int m)(t) dt) \cos(\omega_c t) \\ - \sin(\beta \int m(t) dt) \sin(\omega_c t) \tag{2}$$

Now, the output $v_q(t)$ of the vector modulator is given by:

$$v_q(t) = I(t) \cos(\omega_c t) - Q(t) \sin(\omega_c t) \tag{3}$$

Thus, the in-phase and quadrature signals I(t) and Q(t) required to produce a vector-modulator output equivalent to frequency modulation are given by:

$$I(t) = \cos(\beta \int m(t) dt) \tag{4a}$$

$$Q(t) = \sin(\beta \int m(t) dt) \tag{4b}$$

In principle, these are precisely the signals generated by the integrating circuit 52 and the cosine and sine circuits 54 and 56.

However, computational considerations ordinarily dictate that the simple integration temporarily assumed above be augmented. One computational consideration arises from the possibility that the message signal has a DC component. The presence of a DC component, of course, would cause the output of a simple integration to grow without bound and thus exceed the range of the integration circuitry. Moreover, the subsequent trigonometric calculations impose additional limitations.

Specifically, because the sine and cosine will typically be computed by using a power-series expansion, table-look-up methods, or a combination of both, it is important to keep the arguments of those functions relatively low in order to avoid the need for too many power-series terms or too many lookup-table entries. Keeping in mind that the sine and cosine functions are periodic, therefore, one might simply truncate the integrator output by subtracting or adding $2\pi$ from time to time to keep the output value between $-\pi$ and $+\pi$.

Another approach to bounding the integration computation, which we have employed, takes advantage of the fact that there is negligible information in the very-low-frequency part of a message signal. The DC component can be eliminated by incorporating a high-pass filter in the integrator circuit 52. Specifically, we have combined the integrator function $1/s$ with a high-pass function $s^2/(1+s/40\pi)^2$ to yield a composite integrating-circuit transfer function of $s/(1+s/40\pi)^2$. For the 48.6 kHz sample rate of the digital-signal-processing circuitry that we use, a corresponding z-domain expression is as follows:

$$H(z) = \frac{97200(1-z^{-2})}{59984 - 119658 z^{-1} + 59675 z^{-2}} \tag{5}$$

Figure 2:
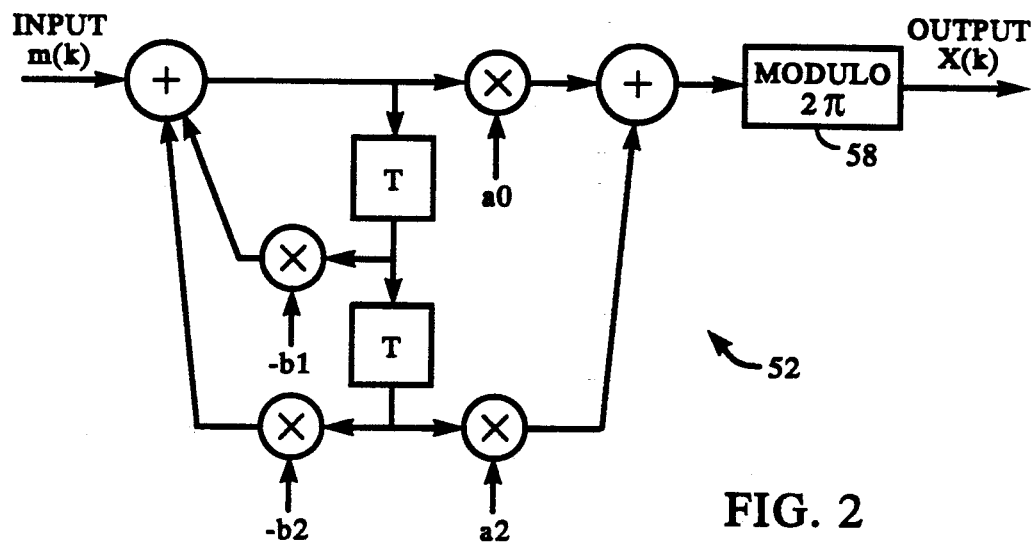
FIG. 2 is a more-detailed block diagram depicting a digital-signal-processing-circuit arrangement for implementing the integrating circuit.

FIG. 2 depicts one implementation of this transfer function, in which $a_0 = -a_2 = 97200/59984$, $b_1 = -119658/59984$, and $b_2 = 59675/59984$.

This filtering results in a bounded output, but its output range in this case still exceeds $2\pi$. To facilitate the trigonometric-function computation further, therefore, we follow the filtering with a truncation represented in FIG. 2 by a modulo-$2\pi$ block 58.

Figure 3:
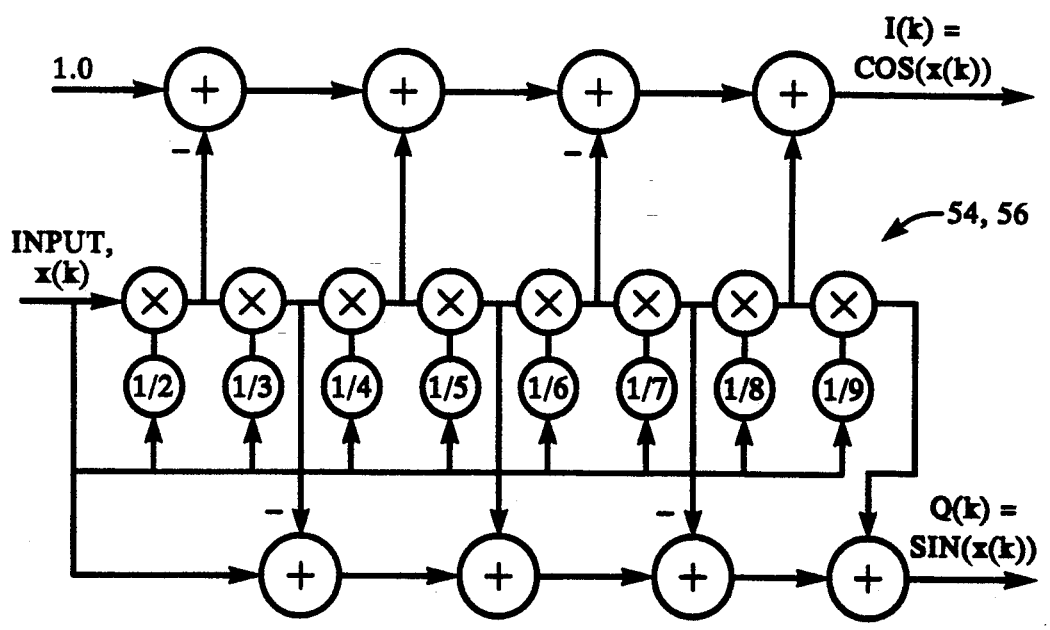
FIG. 3 is a more-obtained block diagram of a digital-signal-processing-circuit arrangement for implementing this trigonometric-function calculation.

Although FIG. 1 depicts the sine and cosine computations separately, we perform them in common steps in a manner that FIG. 3 depicts. As that drawing shows, the sine and cosine functions are approximated by all their power-series terms below the tenth degree.

Those skilled in the art will recognize that the arrangement described above is subject to very little of the FM-deviation variation that most voltage-controlled-oscillator embodiments suffer. Accordingly, it should lend itself to manufacture in most cases without the need for individual radio testing and alignment for proper frequency deviation. Moreover, it eliminates much of the circuit duplication that would otherwise be required in a dual-mode cellular telephone. The invention thus constitutes a significant advance in the art.

We claim:

1. A dual-mode transmitter alternatively operable in PSK and analog-FM states, adapted to receive a message signal, and comprising:

A) a vector modulator, adapted to receive in-phase and quadrature modulating signals, for adding together in-phase and quadrature versions of a carrier in proportion to respective ones of the in-phase and quadrature modulating signals to produce a transmitter output;

B) analog-state circuitry including:
  i) an integrating circuit for performing at least one signal-processing operation, including a time-integration operation, on the message signal when the transmitter is in the analog state to produce an integrating-circuit output; and
  ii) sine and cosine circuitry for generating analog-state quadrature and in-phase modulating signals respectively representing of the sine and cosine of the integrating-circuit output when the transmitter is in the analog state and applying the analog-state in-phase and quadrature modulating signals to the vector modulator; and C) PSK-state circuitry for generating from the message signal and applying to the vector modulator when the transmitter is in the PSK stage PSK in-phase and quadrature modulating signals that cause the vector modulator to produce a phase-shift-keyed version of the message signal.

2. A transmitter as defined in claim 1 wherein the integrating circuit performs both integration and high-pass filtering.

3. A transmitter as defined in claim 1 wherein the integrating circuit performs both integration and high-pass filtering.

* * * * *